(12) United States Patent
Mielnik et al.

(10) Patent No.: US 10,368,458 B2
(45) Date of Patent: Jul. 30, 2019

(54) RAIL-MOUNTED CONTROL SYSTEM WITH IMPROVED MOUNTING

(71) Applicants: ABB Schweiz AG, Baden (CH); David Mielnik, Painesville, PA (US); Richard Ogorek, Sagamore Hills, OH (US); John Piunno, Painesville, PA (US); Thomas Heilman, Wickliffe, OH (US); Krzystof Miedza, Bay Village, OH (US); Daniel J. Morgan, Cleveland, OH (US); Mike J. Maczuzak, Bratenahl, OH (US)

(72) Inventors: David Mielnik, Painesville, PA (US); Richard Ogorek, Sagamore Hills, OH (US); John Piunno, Painesville, PA (US); Thomas Heilman, Wickliffe, OH (US); Krzystof Miedza, Bay Village, OH (US); Daniel J. Morgan, Cleveland, OH (US); Mike J. Maczuzak, Bratenahl, OH (US)

(73) Assignee: ABB Schweiz AG, Baden (CH)

( * ) Notice: Subject to any disclaimer, the term of this patent is extended or adjusted under 35 U.S.C. 154(b) by 28 days.

(21) Appl. No.: 15/555,812

(22) PCT Filed: Mar. 2, 2016

(86) PCT No.: PCT/US2016/020453
§ 371 (c)(1),
(2) Date: Sep. 5, 2017

(87) PCT Pub. No.: WO2016/141059
PCT Pub. Date: Sep. 9, 2016

(65) Prior Publication Data
US 2018/0092235 A1   Mar. 29, 2018

Related U.S. Application Data

(60) Provisional application No. 62/127,274, filed on Mar. 2, 2015.

(51) Int. Cl.
| | |
|---|---|
| *H05K 5/03* | (2006.01) |
| *H05K 5/00* | (2006.01) |
| *H01R 12/70* | (2011.01) |
| *H05K 7/14* | (2006.01) |

(Continued)

(52) U.S. Cl.
CPC ....... *H05K 7/1474* (2013.01); *H01R 12/7058* (2013.01); *H01R 12/716* (2013.01);
(Continued)

(58) Field of Classification Search
CPC ...... H05K 7/1474; H05K 5/03; H05K 7/1468; H05K 5/0017; H01R 12/716; H01R 12/7058; H01R 9/2608; H01R 9/26
See application file for complete search history.

(56) References Cited

U.S. PATENT DOCUMENTS 5,513,067 A * 4/1996 Ishihara ................ G06F 1/1616
361/679.32
6,172,875 B1 * 1/2001 Suzuki ................... G06F 1/183
361/679.4

(Continued)

FOREIGN PATENT DOCUMENTS

| DE | 29723752 U1 | 5/1999 |
|---|---|---|
| EP | 2736062 A1 | 5/2014 |
| WO | 2013054873 A1 | 4/2013 |

OTHER PUBLICATIONS

International Search Search Report and Written Opinion, PCT/EP2016/020453, ABB Technology AG, dated May 13, 2016, 9 pages.

*Primary Examiner* — Abhishek M Rathod
(74) *Attorney, Agent, or Firm* — Taft Stettinius & Hollister LLP; J. Bruce Schelkopf

(57) ABSTRACT

A control system includes a module assembly with a base. The base can be configured for engagement with at least one module having electronic circuitry disposed therein or other electronic device. The base includes at least one latching (Continued)

assembly with a lever operable to move a shuttle coupled to the lever to releasably engage the base with an elongated mounting rail.

20 Claims, 14 Drawing Sheets

(51) Int. Cl.
*H01R 12/71* (2011.01)
*H02B 1/052* (2006.01)
(52) U.S. Cl.
CPC ............ *H05K 5/0017* (2013.01); *H05K 5/03* (2013.01); *H05K 7/1468* (2013.01); *H02B 1/052* (2013.01)

(56) References Cited

U.S. PATENT DOCUMENTS

| | | | | |
|---|---|---|---|---|
| 6,371,435 B1* | 4/2002 | Landis | ................... | H02B 1/052 |
| | | | | 248/694 |
| 6,840,819 B2* | 1/2005 | Bet | ................... | H02B 1/052 |
| | | | | 439/157 |
| 2002/0072256 A1* | 6/2002 | Lostoski | ................... | H01R 9/26 |
| | | | | 439/76.1 |
| 2014/0199864 A1* | 7/2014 | Devanand | ................... | H01R 9/2608 |
| | | | | 439/116 |
| 2014/0226287 A1* | 8/2014 | V | ................... | H02B 1/052 |
| | | | | 361/747 |
| 2015/0229045 A1* | 8/2015 | Falk | ................... | H01R 9/2608 |
| | | | | 439/121 |

* cited by examiner

RAIL-MOUNTED CONTROL SYSTEM WITH IMPROVED MOUNTING

CROSS-REFERENCE TO RELATED APPLICATION

The present application claims the benefit of the filing date of U.S. Provisional Application Ser. No. 62/127,274 filed on Mar. 2, 2015, which is incorporated herein by reference.

BACKGROUND

The present invention relates to industrial control systems and more particularly to industrial control systems having rail-mounted controller and input/output modules having improved mounting features.

Industrial control systems, such as distributed control systems, often include one or more controllers that utilize input signals from field devices, such as flow meters, to provide control output signals to final control elements, such as valves, in order to control a process or one or more sub-processes. Such control systems are typically module-based and include one or more controller modules and one or more input/output (I/O) modules through which the controller module receives and sends input and output signals from and to the field, respectively. The controller module and I/O modules are often mounted to a rail, such as a DIN rail. Conventionally, the rail is mounted horizontally, with the modules being mounted thereto so as to be arranged in a side-by-side manner.

Rail-mounted control systems must have a flexible design that permits different types and numbers of I/O modules to be connected together with the controller module. In addition, the design should permit modules to be mounted to and removed from the rail in a relatively simple manner. However, this simplicity must be balanced with the need to keep the modules securely fastened to the rail. This balance is often not achieved with conventional rail-mounted control systems.

Therefore, further improvements in mounting of control systems to rails are needed.

SUMMARY

In accordance with the present disclosure, a module assembly for a control system is provided for mounting to a rail, such as a DIN rail. The module assembly includes a base having a mounting structure with a channel formed therein that is adapted to receive the rail. The module assembly also includes a cover and a circuit board between the mounting structure and the cover. The circuit board is connectable to one or more of a power supply, an external device, a controller module, and an input/output module.

The mounting structure further includes a latching assembly that includes a lever and a shuttle. The lever is rotatable to translate the shuttle relative to channel to selectively engage and disengage the module assembly to the rail in the channel.

This summary is provided to introduce a selection of concepts that are further described below in the illustrative embodiments. This summary is not intended to identify key or essential features of the claimed subject matter, nor is it intended to be used as an aid in limiting the scope of the claimed subject matter. Further embodiments, forms, objects, features, advantages, aspects, and benefits shall become apparent from the following description and drawings.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
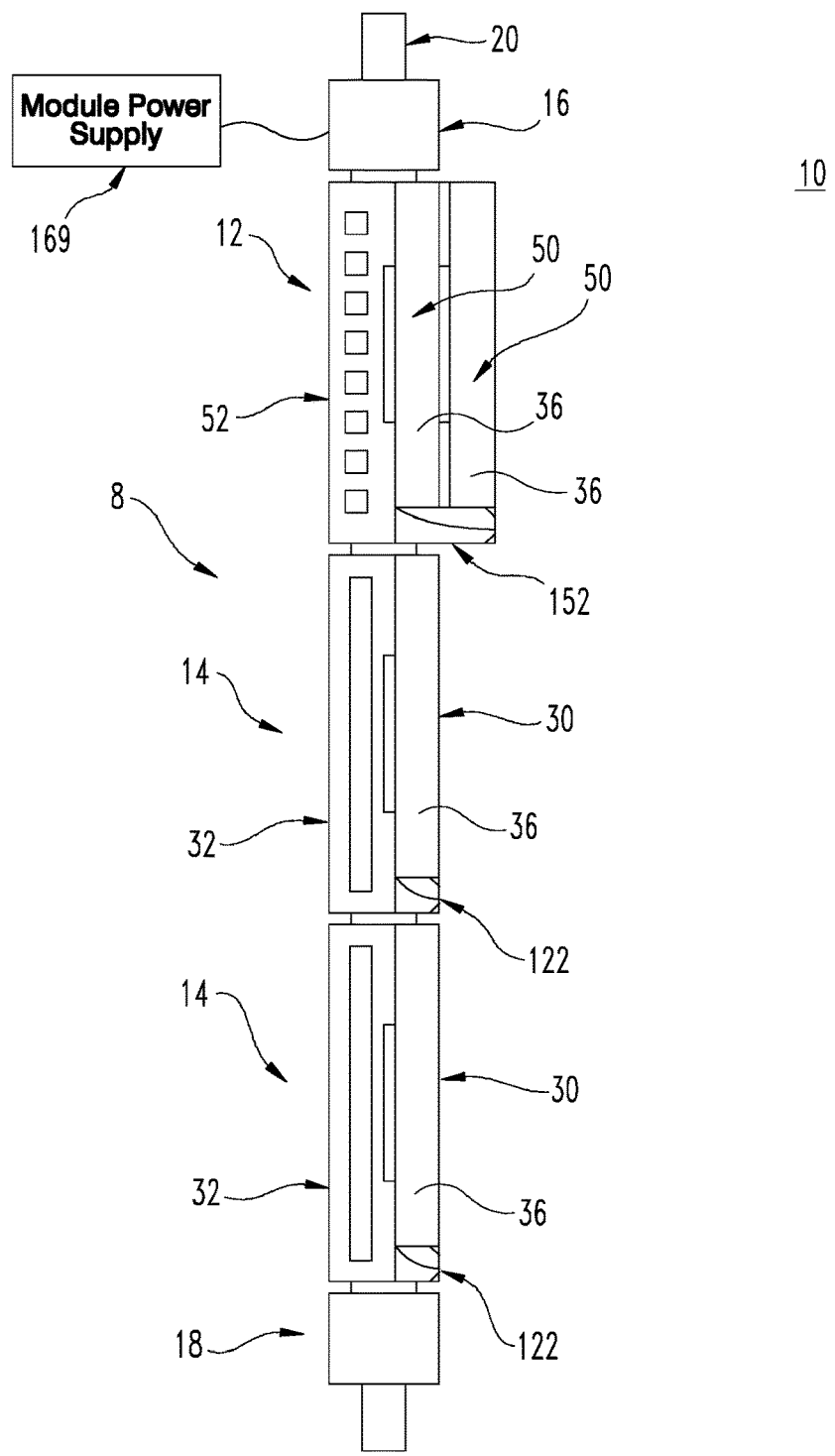
FIG. 1 shows a schematic elevation view of a control system mounted to a rail and connected to a module power supply.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Referring now to FIG. 1, there is shown a module row 8 of a node of an industrial control system 10. The module row 8 comprises a number of module assemblies, such as a controller module assembly 12, a plurality of I/O module assemblies 14 and top and bottom end module assemblies 16, 18 connected to each other and mounted to a vertically-extending top hat type DIN rail 20. The module row 8 may have a different number of I/O module assemblies 14 and may include a single controller, instead of a redundant controller, as described more fully below. Indeed, the module row 8 typically includes substantially more I/O module assemblies 14. In addition, the node may include one or more additional module rows comprising one or more I/O module assemblies 14 and first and second end module assemblies 16, 18. Each additional module row may be mounted to a separate vertically-extending DIN rail 20. The node may be used to control all or a portion of an industrial process, such as a power generation process. Further, the node may be connected to other nodes of the industrial control system, as described more fully below. The module row 8 and other module rows of the control system 10 may be mounted in an enclosure such as a cabinet (not shown.)

Each I/O module assembly 14 handles a plurality of inputs or a plurality of outputs. A typical control system has one or more I/O module assemblies 14 handling inputs and one or more I/O assemblies 14 handling outputs. The inputs may be analog inputs, digital inputs, thermocouple inputs or RTD inputs. The outputs may be analog outputs or digital outputs. The inputs and outputs (I/O) are typically powered by the sensors and control elements in the field. However, digital outputs may be powered by the I/O module assembly 14, such as when the digital outputs are used to energize relay coils.

Figure 3:
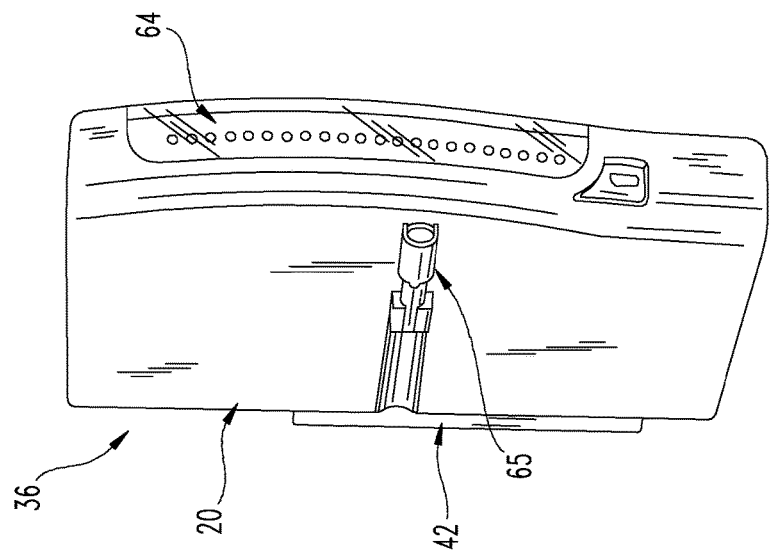
FIG. 3 shows a front left perspective view of the housing of FIG. 2.
Figure 2:
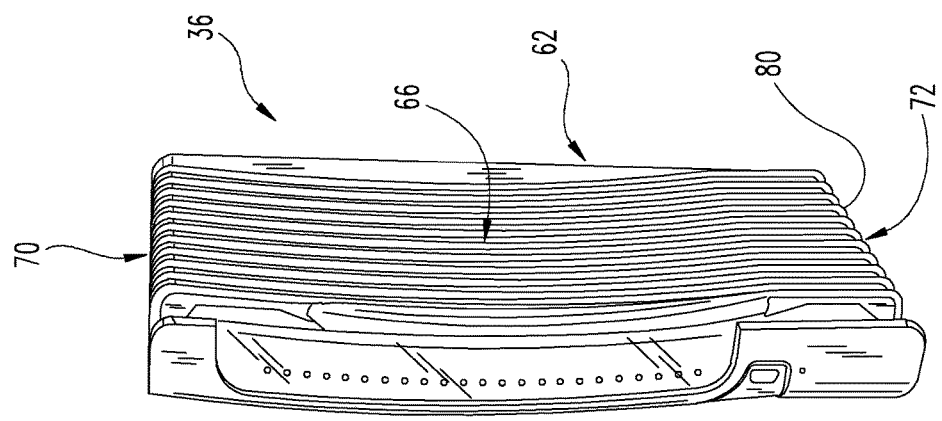
FIG. 2 shows front right perspective view of a housing of a controller module or of an I/O module of the control system of FIG. 1.
Figure 4:
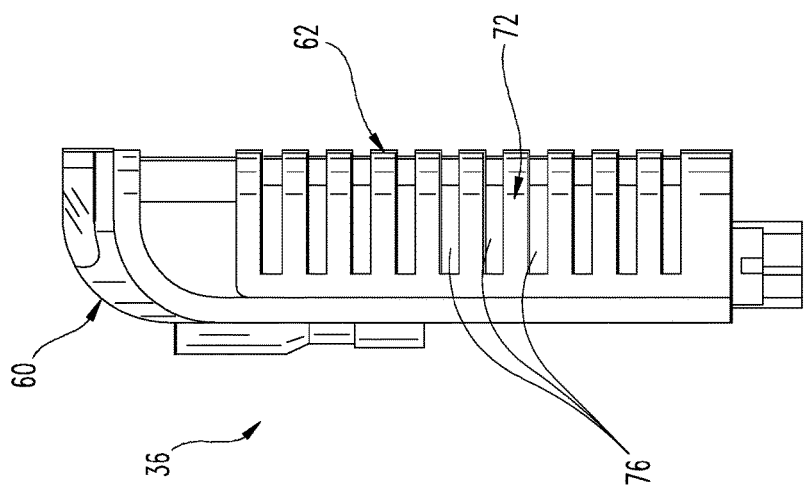
FIG. 4 shows a top plan view of the housing of FIG. 2.
Figure 5:
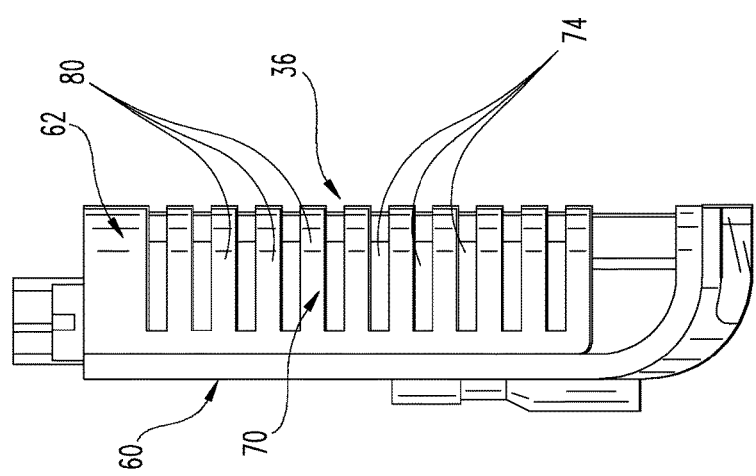
FIG. 5 shows a bottom plan view of the housing of FIG. 2.

Each I/O module assembly 14 comprises an I/O module 30 releasably mounted to an I/O base 32. Each I/O module 30 includes a two-piece plastic outer housing 36 enclosing one or more circuit boards. The housing 36 defines a rear plug 42 (shown in FIG. 3) within which is disposed a connecting portion of the circuit board(s). Circuitry on the circuit board(s) processes field inputs received from sensors in the field or control outputs received from the controller assembly 12, depending on whether the I/O module 30 handles inputs or outputs. More specifically, the circuitry converts between field signals (e.g., analog 4-20 mA, digital 24 VDC etc.) and digital controller signals, such as by using analog-to-digital and/or digital-to-analog converters. The circuitry also conditions the signals received from or going to the field, such as by using switches, filters and multiplexers, and isolates the field signals from the controller assembly 12.

The controller module assembly 12 includes a pair of redundant controller modules 50 releasably mounted to a controller base 52. Each of the controller modules 50 has a construction similar to each I/O module 30 and includes one or more circuit boards mounted inside a two-piece plastic outer housing 36. A connecting portion of the circuit board(s) is disposed within the rear plug 42 of the outer housing 36 of each controller module 50. The circuit board(s) in each controller module 50 includes a microprocessor, memory and other circuitry. The memory stores control programs that may be executed by the microprocessor of each controller module 50. The control programs in each controller module 50 include one or more control loops, such as PID loops, which work on one or more field inputs to generate control outputs. The field inputs and control outputs are routed to and from the controller module assembly 12 through the I/O module assemblies 14 via a module communication bus, which extends through and is formed by the I/O bases 32. Each controller module 50 is programmed with and can execute the same control programs; however, only one of the controller modules 50 (the primary) executes the control programs to control the industrial process at any one time. If the primary controller module 50 fails, the other controller module 50 (the secondary) automatically takes over and executes the control programs to control the industrial process.

Reference is now made to FIGS. 2, 3, 4 and 5. As set forth above, each I/O module 30 and each controller module 50 includes an outer housing 36. The outer housing 36 comprises a first section 60 and a second section 62. The first section 60 has a closed exterior (i.e., no openings) and includes a window 64 through which status LEDs may be viewed. A side mount 65 is fixed to a side wall of the first section 60. The second section 62 has a side wall 66 extending between and top and bottom ends 70, 72. A series of top openings 74 extend through the top end 70, while a series of bottom openings 76 extend through the bottom end 72. A series of ridges 80 separate both the top openings 74 and the bottom openings 76. The ridges 80 extend over the top end 70, along the side wall 66 and over the bottom end 72. The top and bottom openings 74, 76 permit air to flow through the housing 36 to cool the electronic components mounted on the circuit board(s) disposed therein. More specifically, air enters the housing 36 through the bottom openings 76, passes over the circuit board(s) and exits the housing 36 through the top openings 74.

As set forth above, each of the I/O modules 30 is mounted to an I/O base 32. The I/O bases 32, and the bases of the controller module assembly 12 and top and bottom end module assemblies 16, 18, are each adapted for releasably secure mounting to the DIN rail 20 with one or more latching assemblies 14, as discussed further below.

Figure 6:
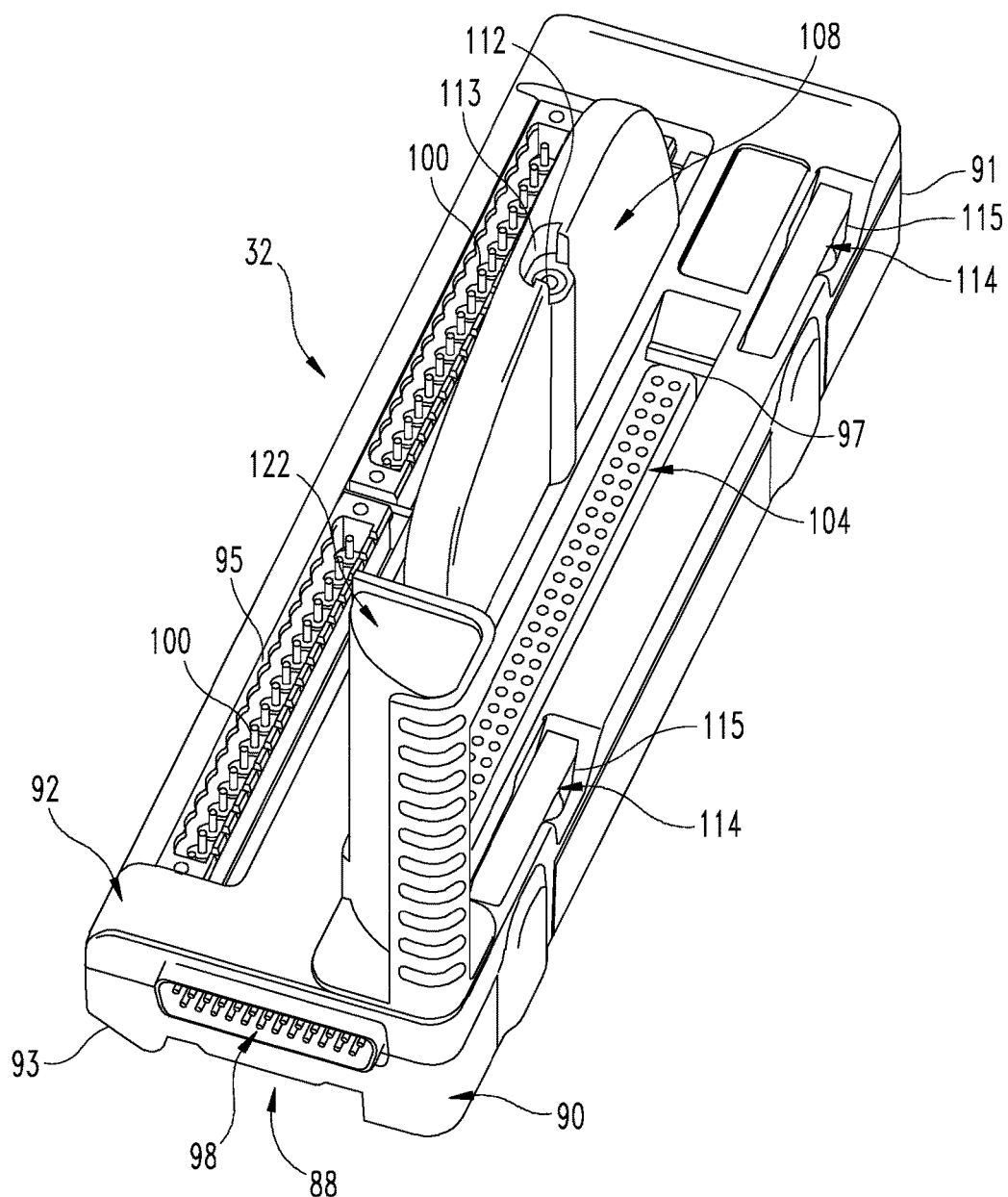
FIG. 6 shows a front perspective view of a base for an I/O type module assembly of the control system of FIG. 1.
Figure 7:
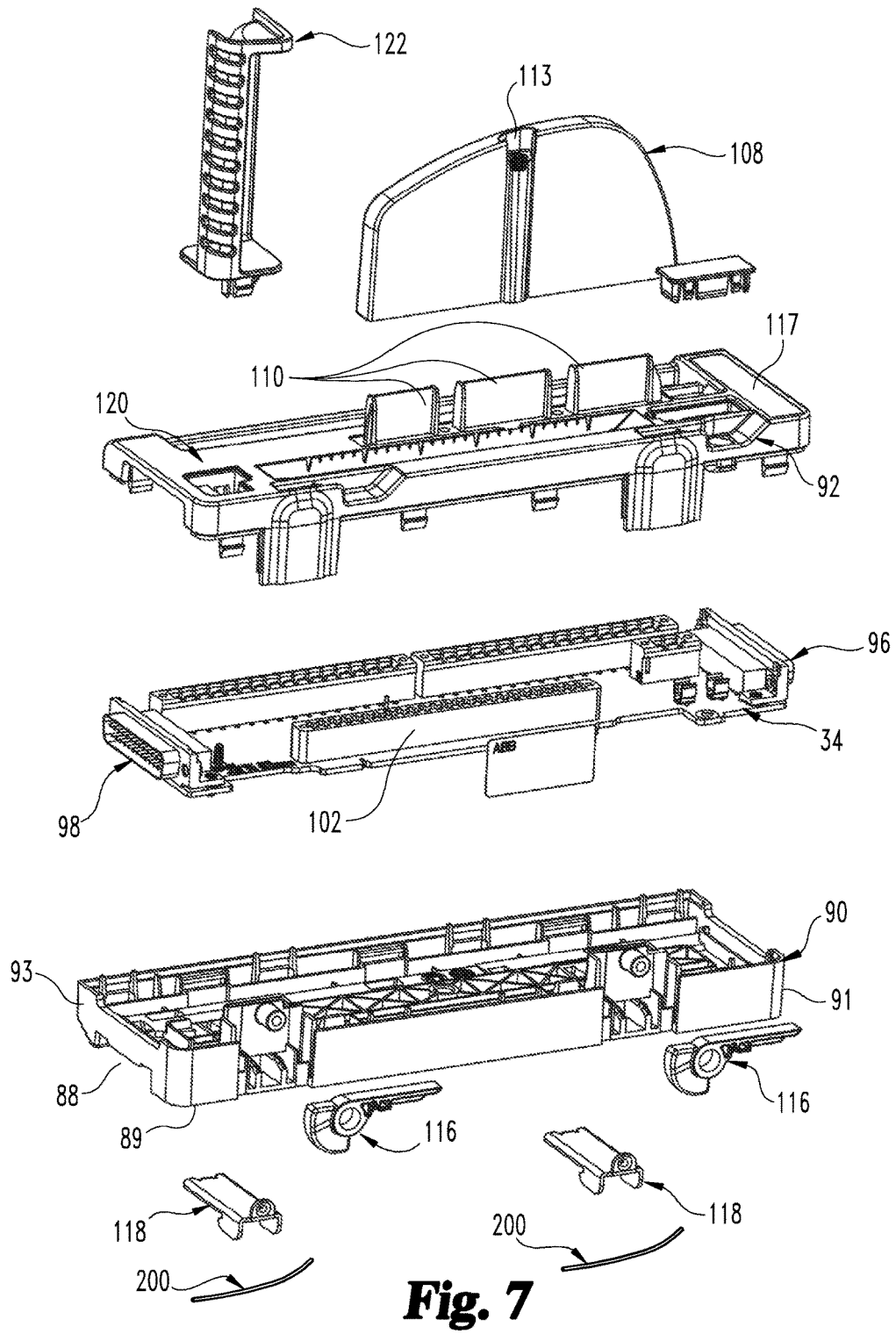
FIG. 7 shows an exploded view of the I/O base of FIG. 6.

Referring now to FIGS. 6 and 7, each I/O base 32 is rectangular and is generally comprised of a circuit board 34 disposed between and enclosed by a mounting structure 90 and a cover 92. A vertically extending rail channel 88 is formed in a rear side 89 of the mounting structure 90 and extends between and opens at opposite ends 91, 93 of mounting structure 90. The rail channel 88 is adapted for receiving the DIN rail 20. A power connector 111 extends from the front side 117 of the I/O base 32 and is electrically connected to the circuit board 34. The power connector 111 is adapted for connection to a supply of power (e.g. 24 VDC) for powering digital outputs, as described above.

Top and bottom pin connectors 96, 98 extend from top and bottom ends 91, 93 of the mounting structure 90 of I/O base 32, respectively. The top and bottom pin connectors 96, 98 are mounted to, and connected together, by the circuit board 34. Together, the circuit board 34 and the top and bottom pin connectors 96, 98 help form the module communication bus, as well as the module power bus. The top pin connector 96 of an I/O base 32 is adapted to engage and connect to a bottom pin connector 98 of another, adjacent I/O base 32, or to a bottom pin connector 138 of a controller base 52. In this manner, a plurality of I/O bases 32 may be connected together to form a series of I/O bases 32 through which the module bus and the power bus extend.

A first enlarged opening 95, generally rectangular in shape, extends through the cover 92 of the I/O base 32 and into its interior. A pair of connectors 100 are disposed in the first enlarged opening 95 and are mounted to the circuit board 34 inside the I/O base 32. Each connector 100 is adapted to receive, in a plug-in type manner, a plug of a terminal block or a plug of a marshaling cable. In this manner, a pair of terminal blocks or plugs of a pair of marshaling cables, or one terminal block and one plug of a marshaling cable may be removably mounted to the I/O base 32. Screws may be used to releasably fasten a terminal block or a marshaling cable plug to a connector 100. The terminal blocks provide connections for field wiring connected to field devices, such as transmitters and actuators. Marshaling cables provide connections to marshaling enclosures, inside of which connections to field wiring are made.

A second enlarged opening 97, generally rectangular in shape, extends through the cover 92 and into the interior of the I/O base 32. A circuit board connector 102 connected to the circuit board 34 is disposed in and accessible through the second enlarged opening. The enlarged opening 97 and the connector 102 form a socket 104 for receiving the plug 42 and the connecting portion of the circuit board of an I/O module 30.

A mounting wall or hump 108 is secured over posts 110 extending outwardly from the cover 92. A threaded bore insert 112 is secured inside the hump 108 at the bottom of a socket 113 formed at the top of the hump 108. The socket 113 is configured to receive a portion of a side mount 65 of a housing 36 of an I/O module 30. When a side mount 65 is so disposed in the socket 113, a screw may be inserted through the side mount 65 and threadably received in the threaded bore insert 112, thereby releasably securing the I/O module 30 to the hump 108 and, thus, the I/O base 32.

A pair of smaller openings or slots 115 in cover 92 are disposed adjacent to the socket 104. Levers 116 of a pair of latching assemblies 114 are movably mounted within the slots 115, respectively. When in the engaged position the levers 116 are flush with the cover 92. Cover 92 can include a depression adjacent to slots 115 to facilitate access to the lever 116 when flush with the cover 92. Each latching assembly 114 further includes a shuttle 118 operably connected to the lever 116. Each lever 116 is rotatable to move shuttle 118 between a first latched position and a second unlatched position. In the latched position, the lever 116 is disposed substantially flush with the front side of cover 92 (as shown in FIG. 6), whereas in the unlatched position, the lever 116 extends outward from the front side of cover 92. Movement of the lever 116 is operable to move or translate the shuttle 118, which is movably mounted inside the mounting structure 90, adjacent to the rail channel 88. The shuttle 118 is moved by the rotation of lever 116 into and out of engagement with the DIN rail 20 when it is disposed in the rail channel 88 to respectively secure and release the I/O base 32 from the DIN rail 20.

More specifically, when the lever 116 is in the unlatched position, the shuttle 118 does not engage the I/O base 32 to the DIN rail 20, whereas when the lever 116 is in the latched position, the shuttle 118 engages the I/O base 32 to the DIN rail 20. In this manner, the I/O base 32 is securable to and releasable from the DIN rail 20. As discussed further below, each of the bases of the various I/O modular assemblies 14, controller module assemblies 12, and the top and bottom end module assemblies 16, 18 disclosed herein includes one or more latch assemblies 114 to similarly releasably engage the respective module assembly to DIN rail 20.

In order to mount an I/O module 30 to the I/O base 32, the levers 116 are placed in the latched position and then the plug 42 of the I/O module 30 is inserted into the socket 104, while the side mount 65 of the I/O module 30 is inserted into the socket of the hump 108. A screw is then inserted through the side mount 65 and threaded into the bore insert 112 of the hump 108. When the I/O module 30 is so mounted to the I/O base 32, the I/O module 30 is disposed on cover 92 and over the levers 116, which are in the latched positions. From this description, it should be appreciated that the I/O base 32 is mounted to the DIN rail 20 without the I/O module 30 being mounted thereto in order to permit the levers 116 to be manually manipulated. This provides a compact arrangement and prevents operation of the levers while the module is attached. However, in other embodiments the levers 116 are accessible when the I/O or other module is plugged into the respective socket 104.

A mounting opening 120 is formed in the cover 92, toward a lower right corner thereof. The mounting opening 120 is configured to receive, in a snap-fit manner, mounting projections of a (single wide) air deflector 122 so as to releasably secure the air deflector 122 to the I/O base 32. When the air deflector 122 and an I/O module 30 are mounted to the I/O base 32, the air deflector 122 extends across the width of the I/O module 30 and covers the bottom openings 76 thereof. The air deflector 122 is constructed to direct air from a direction to the right of the I/O base 32 (as viewed from FIG. 1) into the bottom openings 76 of the I/O module 30 mounted to the I/O base 32 and to direct air exiting the top openings 74 of another I/O module 30 located below the I/O base 32 to the left of the I/O base 32 and away from the bottom openings 76 of the I/O module 30 mounted to the I/O base 32. Moreover, the air deflector 122 acts as a shield to prevent warm air exiting the I/O module 30 located below the I/O base 32 from entering the bottom openings 76 of the I/O module 30 mounted to the I/O base 32.

Figure 8:
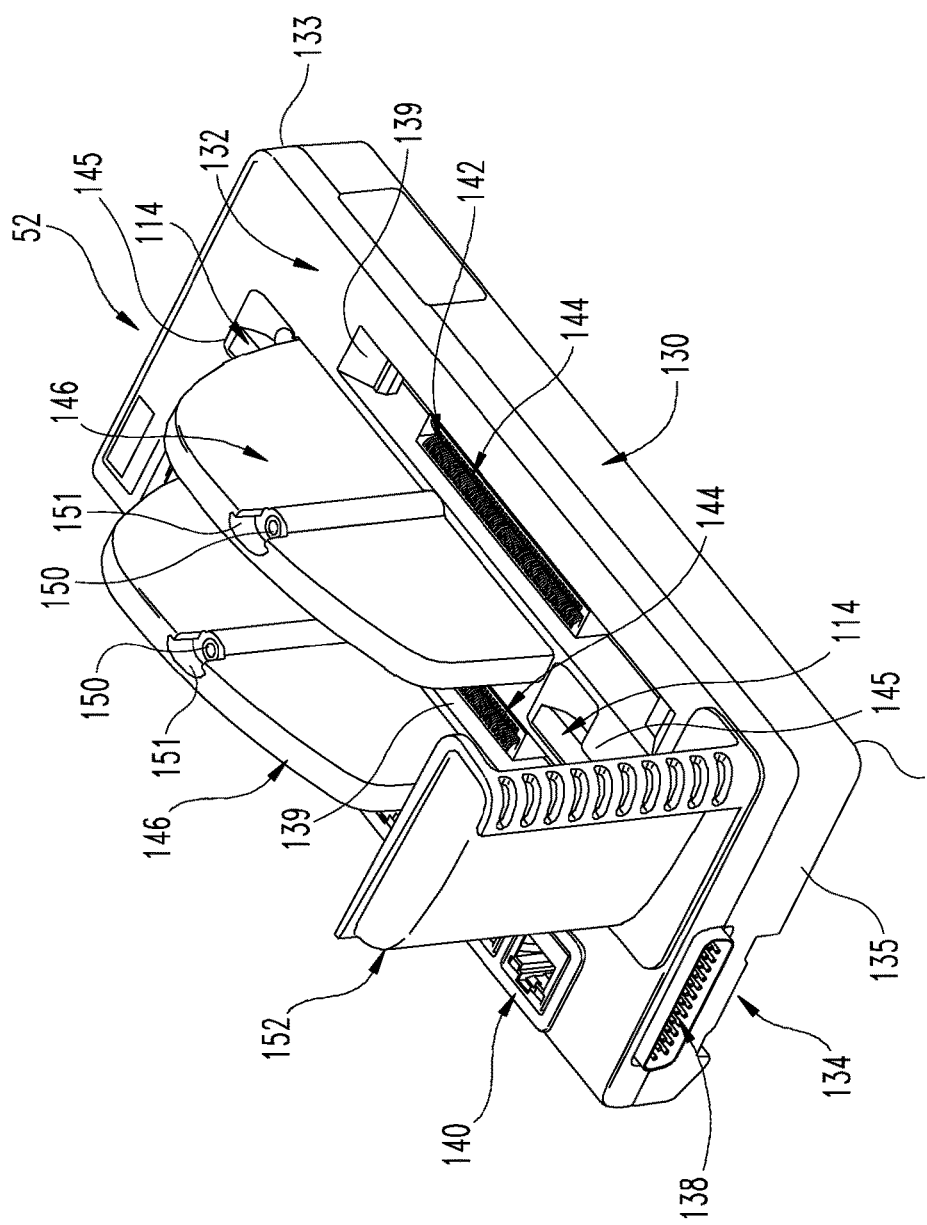
FIG. 8 shows a front perspective view of a base for a controller type module assembly of the control system of FIG. 1.
Figure 9:
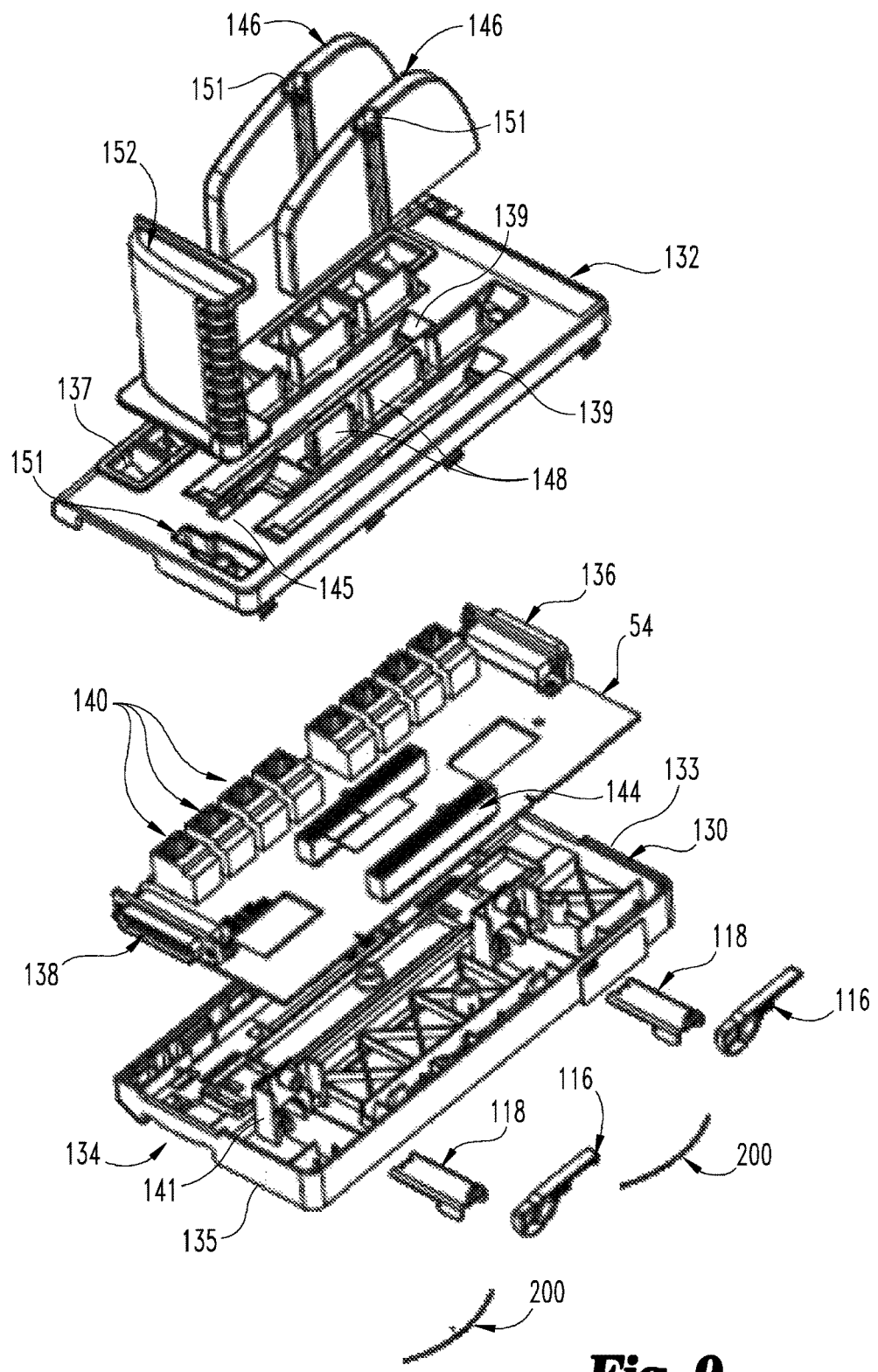
FIG. 9 shows an exploded perspective view of the base of FIG. 8.

Referring now to FIGS. 8 and 9, the controller base 52 is also rectangular, but is substantially wider than an I/O base 32 because it mounts two (controller) modules. Similar to the I/O base 32, the controller base 52 is generally comprised of a circuit board 54 disposed between and enclosed by a mounting structure 130 and a cover 132. A vertically extending rail channel 134 is formed in a rear side 131 of the mounting structure 130 and opens at the top and bottom ends 133, 135 of the mounting structure 130. The rail channel 134 is adapted for receiving the DIN rail 20.

Top and bottom pin connectors 136, 138 extend from top and bottom ends 133, 135 of the mounting structure 130 of controller base 52, respectively. The top and bottom pin connectors 136, 138 are mounted to, and connected together, by the circuit board 54. Together, the circuit board 54 and the top and bottom pin connectors 136, 138 help form the module communication bus, as well as the module power bus. The bottom pin connector 138 of the controller base 52 is adapted to engage and connect to a top pin connector 96 of an adjacent I/O base 32. In this manner, the controller base 52 can be connected to and communicate with a series of I/O bases 32.

A series of rectangular openings 137 extend through the cover 132 of the controller base 52 and into its interior. Ethernet jacks 140 are disposed in the openings 137, respectively, and are mounted to the circuit board 54 inside the controller base 52. The Ethernet jacks 140 are adapted to receive plugs of Ethernet cables (not shown), respectively. When the controller modules 50 are connected to the controller base 52, the Ethernet jacks 140 are connected to an Ethernet foreign device interface in the controller modules 50. In this manner, the controller modules 50 can communicate with other devices over Ethernet cables plugged into the Ethernet jacks 140. More specifically, the controller modules 50 can communicate with other controller modules 50 (in other nodes) similarly connected to the Ethernet cables, and/or with operator workstations connected to the Ethernet cables. The controllers 50 may use a protocol, such as Modbus TCP, to communicate with other devices connected to the Ethernet cables.

A pair of enlarged openings 139, each generally rectangular in shape, extend through the cover 132 and extend into the interior of the controller base 52. A pair of circuit board connectors 142 connected to the circuit board 54 are disposed in and accessible through the enlarged openings 139, respectively. The enlarged openings 139 and the connectors 142 form sockets 144 for receiving the plugs 42 and the connecting portions of the circuit boards of the controller modules 50, respectively.

A pair of mounting walls or humps 146 are secured over posts 148 extending outwardly from the cover 132. The humps 146 are provided to secure the controller modules 50 to the controller base 52. As such, one of the humps 146 is disposed between the sockets 144. A threaded bore insert 150 is secured inside each hump 146 at the bottom of a socket 151 formed at the top of the hump 146. The socket 151 in each hump 146 is configured to receive a portion of a side mount 65 of a housing 36 of a controller module 50. When a side mount 65 is so disposed in the socket 151, a screw may be inserted through the side mount 65 and threadably received in the threaded bore insert 150, thereby releasably securing the controller module 50 to the hump 146 and, thus, the controller base 52.

A pair of smaller openings or slots 145 are disposed between a leftmost one of the sockets 144 and a rightmost one of the humps 146. Levers 116 of a pair of latching assemblies 114 in the controller base 52 are movably mounted within the slots 145, respectively. The latching assemblies 114 have the same construction as those described above in the I/O base 32. Thus, the controller base 52 is secured to and released from the DIN rail 20 by moving the levers 116 and shuttles 118 between the latched and unlatched positions, as with the I/O bases 32.

In order to mount a leftmost one of the controller modules 50 to the controller base 52, the levers 116 are placed in the latched position and then the plug 42 of the leftmost one of the controller modules 50 is inserted into the leftmost one of the sockets 144, while the side mount 65 of the leftmost one of the controller modules 50 is inserted into the socket 151 of the leftmost one of the humps 146. A screw is then inserted through the side mount 65 and threaded into the bore insert 150 of the leftmost one of the humps 146. When the leftmost one of the controller modules 50 is so mounted to the controller base 52, the leftmost one of the controller modules 50 is disposed over the levers 116 (which are in the latched positions).

From this description, it should be appreciated that the controller base 52 is mounted to the DIN rail 20 without the leftmost one of the controller modules 50 being mounted thereto in order to permit the levers 116 to be manually manipulated. Unlike the leftmost one of the controllers 50, the rightmost one of the controllers 50 may be mounted to the controller base 52 before the controller base 52 is mounted to the DIN rail 20 since it does not prevent access to the levers 116.

A mounting opening 151 is formed in the cover 132, toward a lower right corner thereof. The mounting opening 151 is configured to receive, in a snap-fit manner, mounting projections of a (double wide) air deflector 152 so as to releasably secure the air deflector 152 to the controller base 52. When the air deflector 152 and a pair of controller modules 50 are mounted to the controller base 52, the air deflector 152 extends across the widths of both controller modules 50 and covers the bottom openings 76 thereof. The air deflector 152 is constructed to direct air from a direction to the right of the controller base 52 (as viewed from FIGS. 1 and 8) into the bottom openings 76 of the controller modules 50 mounted to the controller base 52 and to direct air exiting the top openings 74 of an I/O module 30 located below the controller base 52 to the left of the controller base 52 and away from the bottom openings 76 of the controller modules 50 mounted to the controller base 52. Moreover, the air deflector 152 acts as a shield to prevent warm air exiting the I/O module 30 located below the controller base 52 from entering the bottom openings 76 of the controller modules 50 mounted to the controller base 52.

Figure 10:
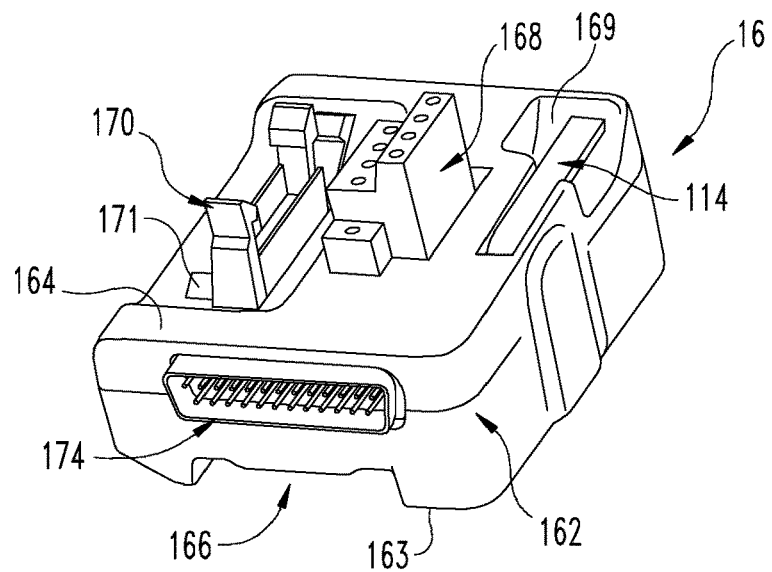
FIG. 10 shows a front perspective view of a top end type module assembly of the control system of FIG. 1.
Figure 12:
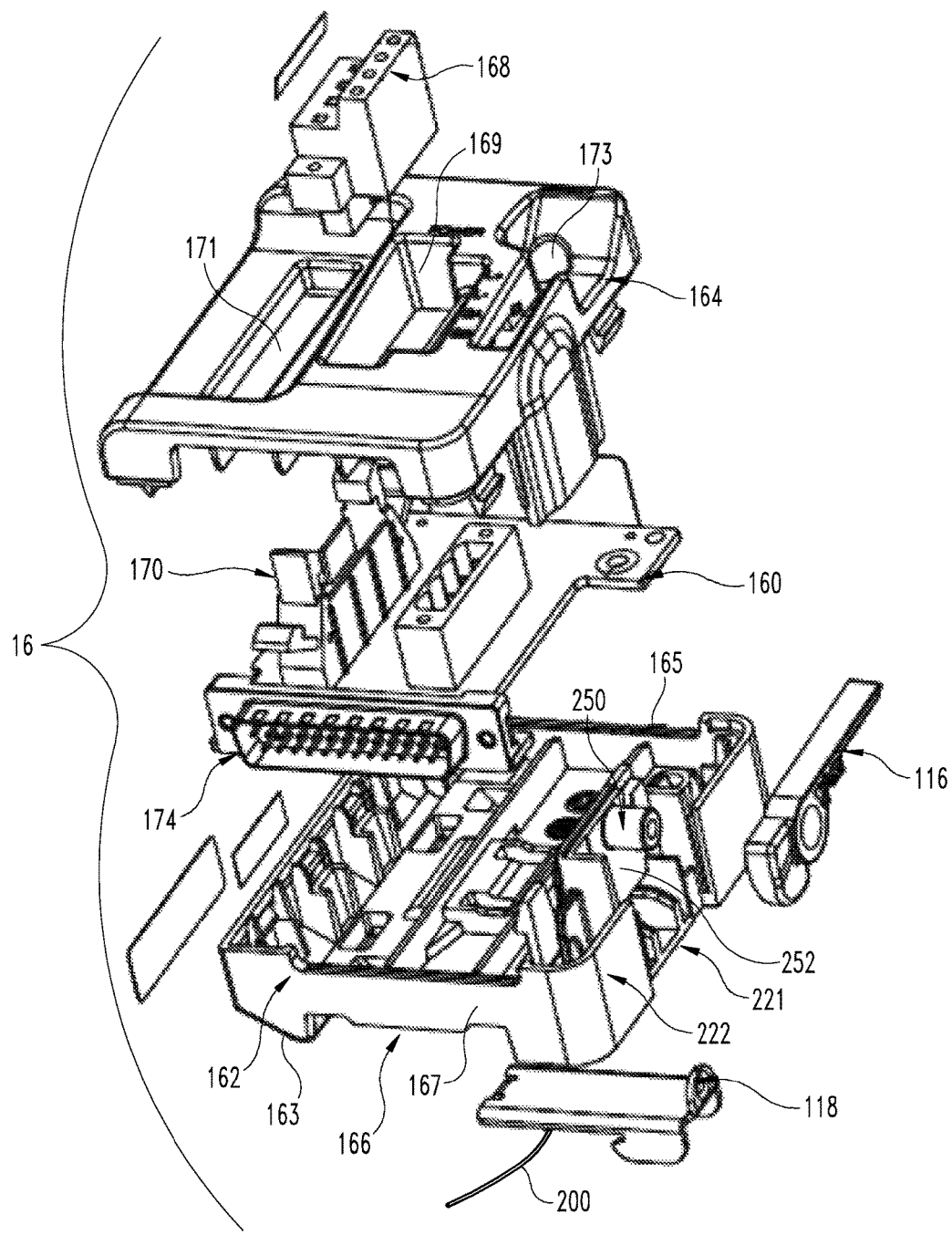
FIG. 12 shows an exploded perspective view of the top end type module of FIG. 10.

Referring now to FIGS. 10 and 12, the top end module 16 is square and is generally comprised of a circuit board 160 disposed between and enclosed by a mounting structure 162 and a cover 164. A vertically extending rail channel 166 is formed in a rear side 163 of the mounting structure 162 and opens at top and bottom ends 165, 167. A power connector 168 is connected to the circuit board 160 and extends through a first opening 169 in the cover 164. The power connector 168 is provided for connection to a module power supply 169 (FIG. 1.) A communication connector 170 is also connected to the circuit board 160 and extends through a second opening 171 in the cover 164. A bottom pin connector 174 is mounted to the circuit board 160 and extends from a bottom end 167 of the top end module 16. The bottom pin connector 174 is adapted to engage and connect to the top pin connector 136 of the controller base 52. The communication connector 170 and the power connector 168 are connected to the bottom pin connector 174 via the circuit board 160 inside the top end module 16. In this manner, the power connector 168 and the communication connector 170 are connected to the module communication bus and the module power bus when the bottom pin connector 174 of the top end module 16 is connected to the top pin connector 136 of the controller base 52. Thus, the module power supply provides power to the module bus through its connection to the power connector 168.

A slot 173 is formed in the cover 164, toward the top and right side of the cover 164. A lever 116 of a latching assembly 114 in the top end module 16 is movably mounted within the slot 173. The latching assembly 114 has the same construction as that described above in the I/O bases 32. Thus, the top end module 16 is secured to and released from the DIN rail 20 by moving the lever 116 and shuttle 118 between the latched and unlatched positions, as with the I/O bases 32.

Figure 11:
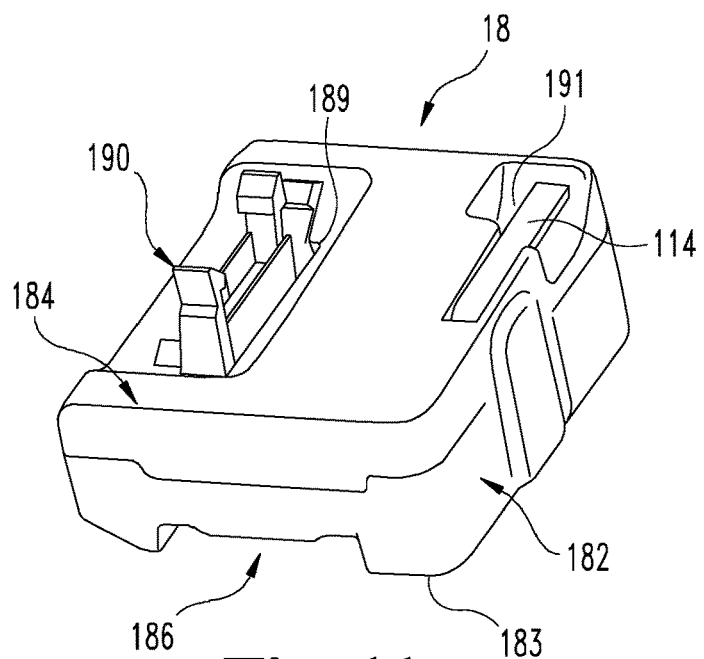
FIG. 11 shows a front perspective view of a bottom end type module assembly of the control system of FIG. 1.
Figure 13:
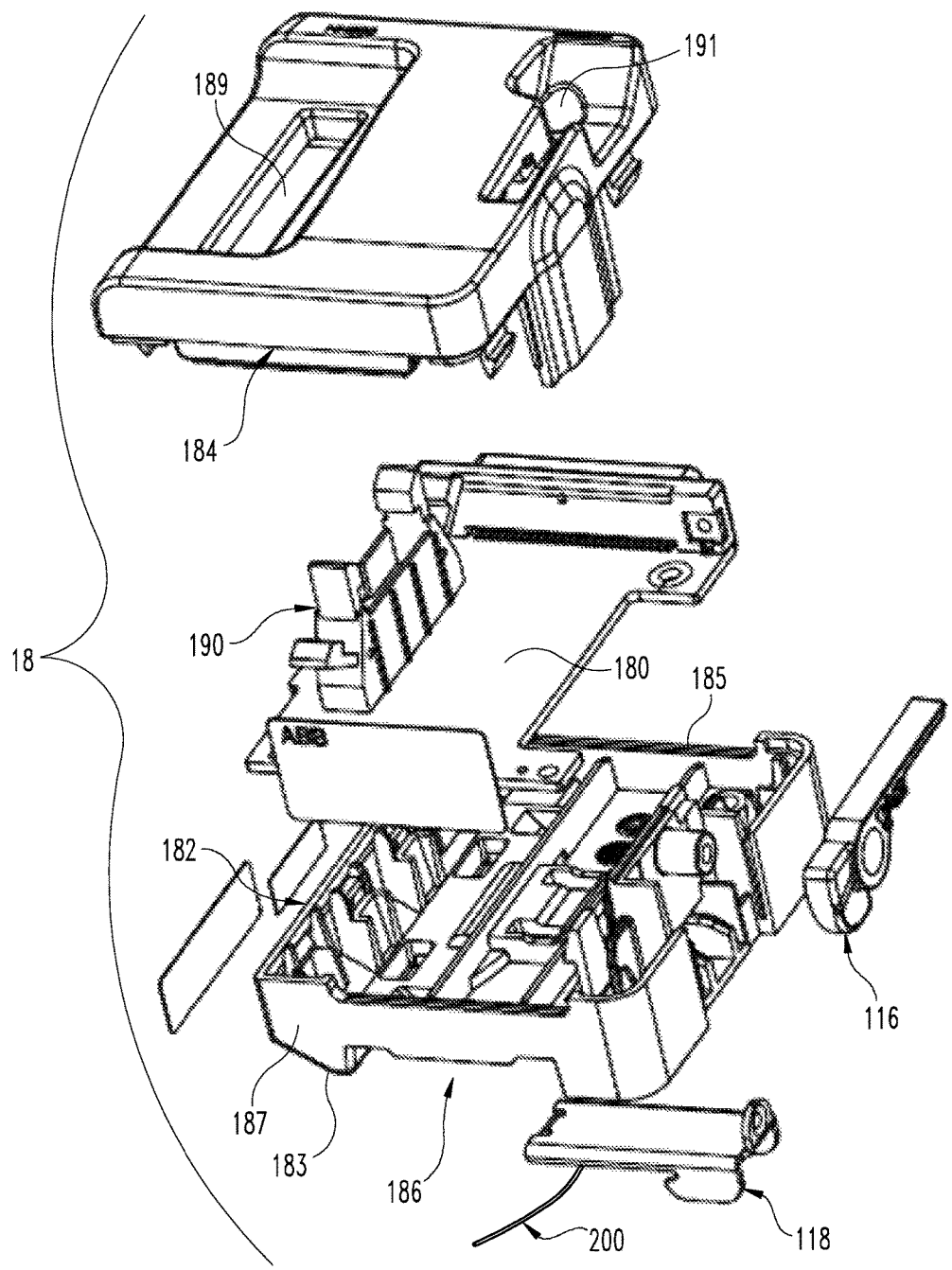
FIG. 13 shows an exploded perspective view of the bottom end type module of FIG. 11.

Referring now to FIGS. 11 and 13, the bottom end module 18 is also square and is generally comprised of a circuit board 180 disposed between and enclosed by a mounting structure 182 and a cover 184. A vertically extending rail channel 186 is formed in a rear side 183 of the mounting structure 182 and opens at top and bottom ends 185, 187. A communication connector 190 is connected to the circuit board 180 and extends through an opening 189 in the cover 184. A top pin connector 192 is mounted to the circuit board 180 and extends from a top end 185 of the bottom end module 18. The top pin connector 192 is adapted to engage and connect to the bottom pin connector 98 of an I/O base 32. The communication connector 190 is connected to the top pin connector 192 via the circuit board 180 inside the bottom end module 18. The top pin connector 192 is connected to the module communication bus and the module power bus. The communication connector 190 permits the module row 8 to be connected to a second module row comprising top and bottom end modules 16, 18 and one or more I/O assemblies 14. In such an arrangement, the communication connector 190 of the bottom end module 18 in the module row 8 is connected by a cable to the communication connector 170 in a top end module 16 of the second module row. However, if the module row 8 is not connected to a second module row, a circuit board is plugged into the communication connector 190 to close the module bus.

A slot 191 is formed in the cover 184, toward the top and right side of the cover 184. A lever 116 of a latching assembly 114 in the bottom end module 18 is movably mounted within the slot 191. The latching assembly 114 has the same construction as that described above in the I/O bases 32. Thus, the bottom end module 18 is secured to and released from the DIN rail 20 by moving the lever 116 and shuttle 118 between the latched and unlatched positions, as with the I/O bases 32.

Referring back to FIG. 1, within the module row 8, the top end module 16, the controller assembly 12, two I/O assemblies 14 and the bottom end module 18 are mounted to the DIN rail 20. As such, the DIN rail 20 extends through the rail channel 166 of the top end module 16, the rail channel 134 of the controller assembly 12, the rail channels 88 of the two I/O assemblies 14 and the rail channel 186 of the bottom end module 18. The bottom pin connector 174 of the top end module 16 is connected to the top pin connector 136 of the controller base 52, the top pin connector 96 of a top one of the I/O bases 32 is connected to the bottom pin connector 138 of the controller base 52, the bottom pin connector 98 of the top one of the I/O bases 32 is connected to a top pin connector 96 of a lower one of the I/O bases 32, and the top pin connector 192 of the bottom end module 18 is connected to the bottom pin connector 98 of the bottom one of the I/O bases 32. With the top end module 16, the controller assembly 12, the two I/O assemblies 14 and the bottom end module 18 so connected, the power bus and the communication bus extend from the top end module 16 down to the bottom end module 18. Power is supplied to the power bus from the module power supply 169 connected to the power connector 168 of the top end module 16.

As described above, each of the top end module 16, the controller base 32, the I/O bases 32 and the bottom end module 18 are secured to the DIN rail 20 by one or more latching assemblies 114. The construction and operation of the latching assembly 114 will now be described with reference to the top end module 16, it being understood that the latching assemblies 114 in the other module assemblies can have substantially the same operation and construction. The main components of the latching assembly 114 are shown in the exploded view of the top end module 16 shown in FIG. 12. The main components include the lever 116, the shuttle 118 and a spring wire 200. The latching assembly 114 cooperates with mounting tabs 199 (FIG. 16) of the top end module 16 that extend into the rail channel 166. The I/O bases 32, the controller base 52 and the bottom end module 18 have mounting tabs 199 that extend into their respective rail channels as well.

Figure 14:
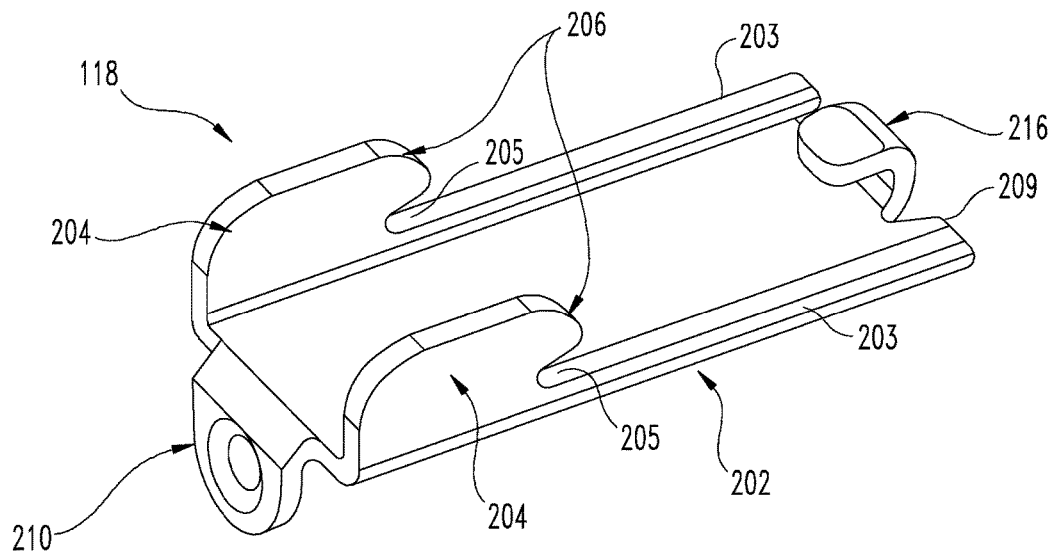
FIG. 14 shows a perspective view of a shuttle of a latching assembly for any of the module assemblies disclosed herein.
Figure 15:
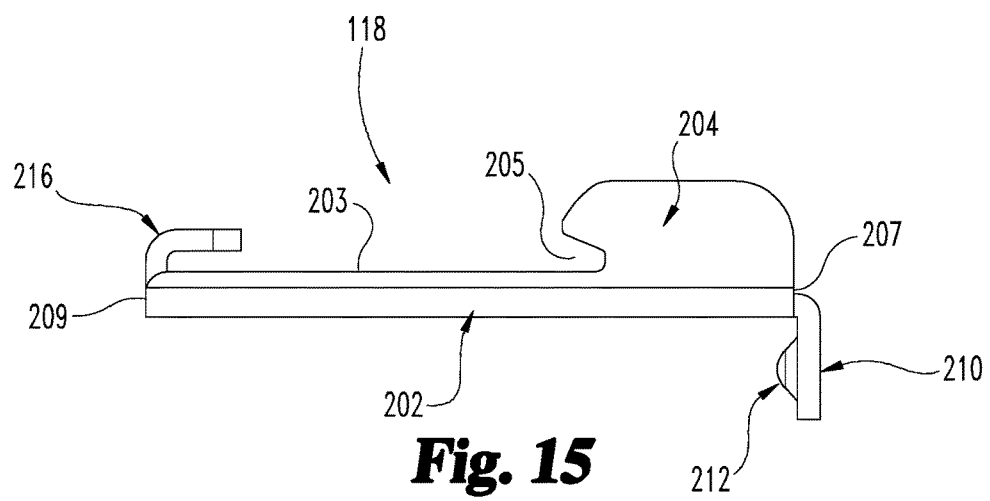
FIG. 15 shows a side view of the shuttle of FIG. 14.

Referring now to FIGS. 14 and 15, one embodiment of the shuttle 118 is shown. Shuttle 118 may be composed of any suitable material such as metal or plastic. Shuttle 118 includes an elongated rectangular body 202 with opposing side flanges 203 along a length thereof. A pair of mounting appendages 204 extend from respective ones of the flanges 203 and extend outwardly from and transversely to the body 202 at, for example, about a 90° angle therefrom. Grooves 205 in respective ones of the mounting appendages 204 provide undercuts that form latching tangs 206 at an end of each of the mounting appendages 204. A cam follower 210 extends from an outer end 207 of the body 202 and projects transversely outwardly therefrom at, for example, about a 90° angle with respect to elongated body 202. The mounting appendages 204 extend outwardly from the body 202 in an opposite direction from cam follower 210. The cam follower 210 has an inwardly-directed dome 212 that faces an opposite inner end 209 of elongated body 202. A hook 216 is extends from the inner end 209 of the body 202. As will be described more fully below, the hook 216 engages the spring wire 200.

Referring now to FIGS. 12, 16, 17, 20 and 21, the shuttle 118 is movably mounted in a lateral channel 220 of the mounting structure 162 of the top end module 16. The lateral channel 220 passes through an opening 221 in a side wall 222 of the mounting structure 162 and intersects the rail channel 166. In certain embodiments, the side wall through which channel 220 extends is the outer side wall of the mounting structure, such as shown for mounting structures 90, 162, 182. In other embodiments, the side wall is an interior side wall that is not the outer side wall, such as shown with interior side wall 141 of mounting structure 130.

Figure 20:
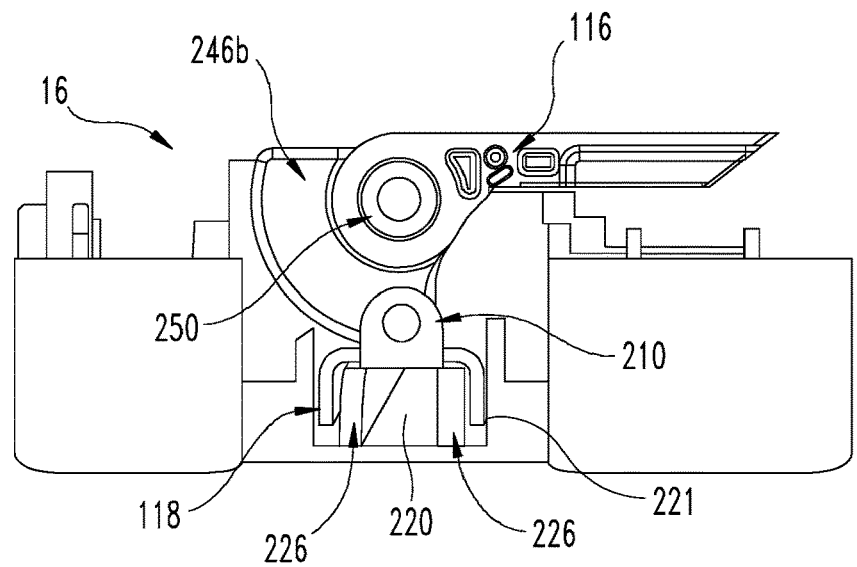
FIG. 20 shows the top end module of FIG. 12 with its cover removed and with the lever of the latch assembly in a latched position.
Figure 21:
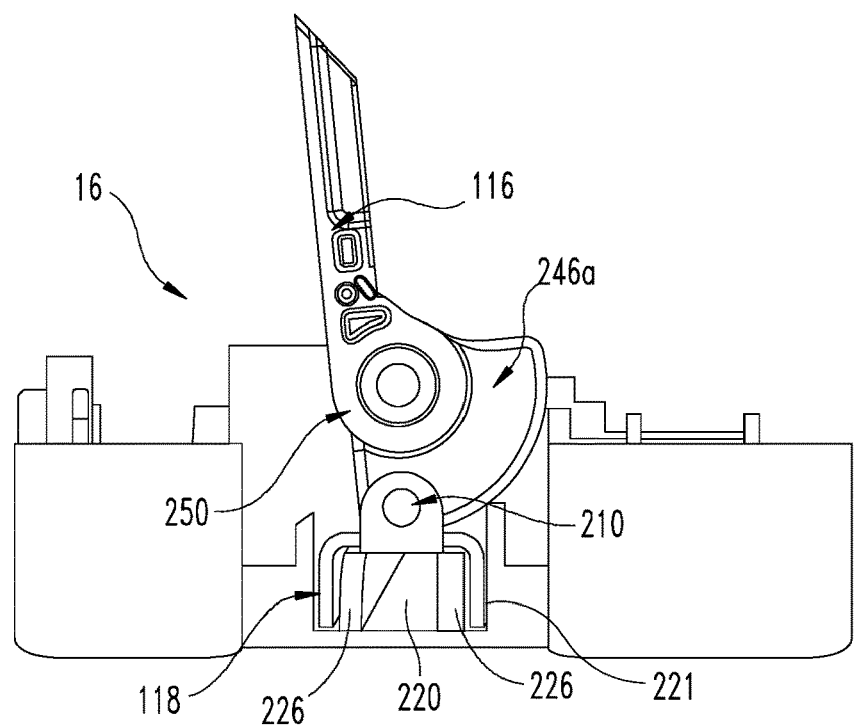
FIG. 21 shows the top end module of FIG. 12 with its cover removed and with the lever of the lever assembly in an unlatched position.

The lateral channel 220 is disposed inward from (away from rear side 163 and toward the interior of the top end module 16) and recessed in a center surface 223 of mounting structure 162 that partially defines the rail channel 166. In this manner, the body 202 of the shuttle 118 is disposed inwardly from the DIN rail 20 so that elongated body 202 does not interfere with DIN rail 20 when the DIN rail 20 is disposed in the rail channel 166. The shuttle 118 is retained in the lateral channel 220 by tabs 224 formed by center surface 223 projecting into rail channel 166, and shuttle 118 is guided in its movement by rails 226 located in the opening 221 in the side wall 222. More specifically, the mounting appendages 204 are disposed in slots formed by the rails 226, as shown in FIGS. 20 and 21, so that the mounting appendages 204 are located on opposite sides of the rails 226 to allow the rails 226 along with tabs 224 to guide the movement of shuttle 118 in lateral channel 220.

The spring wire 200 extends through and is engaged with the hook 216 of the shuttle 118. The spring wire 200 extends in the same direction as the rail channel 166 and is disposed in an arcuate depression 228 formed inwardly (away from rear side 163) from the center surface 223. In this manner, the spring wire 200 is disposed inward from and does not interfere with the DIN rail 20 when the DIN rail 20 is disposed in the rail channel 166. In one embodiment, the spring wire 200 is composed of metal and is of a gauge that permits the spring wire 200 to be temporarily deflected but not deformed, i.e., to act as a spring. Ends of the spring wire 200 are held in slots formed, in part, by tabs 230 projecting from center surface 223 over arcuate depression 228.

Figure 16:
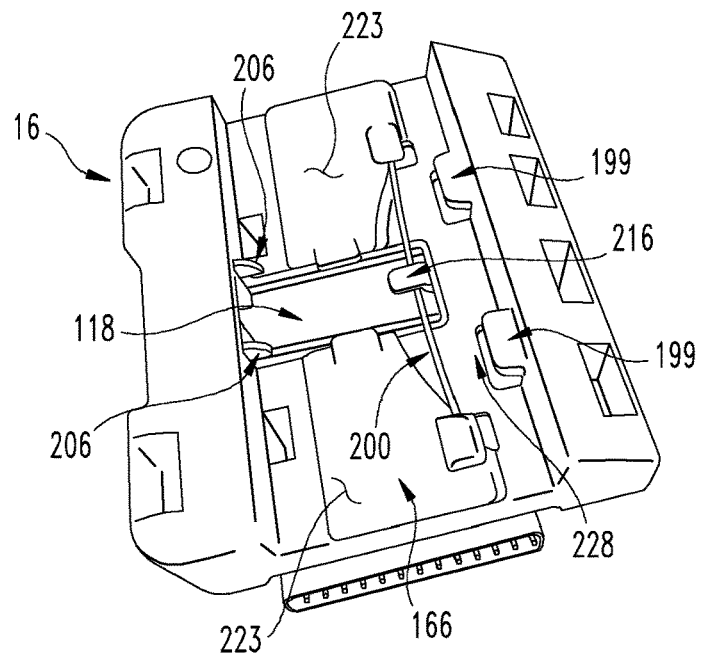
FIG. 16 shows a rear perspective view of the top end module of FIG. 12 with the shuttle being in an engaged position.
Figure 17:
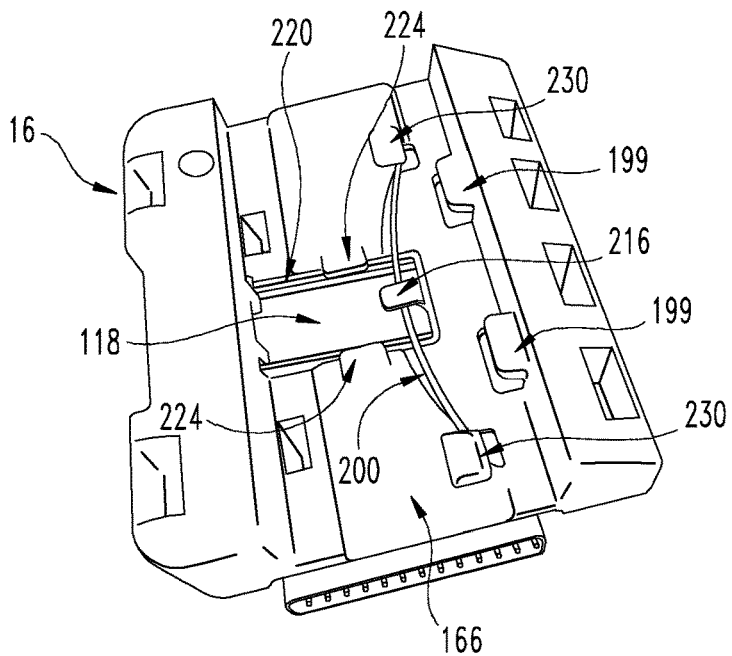
FIG. 17 shows a rear perspective view of the top end module of FIG. 12 with the shuttle being in a disengaged position.

With the shuttle 118 mounted as described above, the shuttle 118 is movable between an engaged position and a disengaged position. The shuttle 118 is operably connected to lever 116 so shuttle 118 is moved between the engaged and disengaged positions by the rotational movement of the lever 116 between the latched and unlatched positions. When the shuttle 118 is in the engaged position, the latching tangs 206 are disposed in the rail channel 166, as shown in FIG. 16, to engage the DIN rail 20. In addition, the spring wire 200 is not deflected and is substantially straight. When the shuttle 118 is in the disengaged position, the latching tangs 206 are not disposed in the rail channel 166 and are retracted into the opening 221, as shown in FIG. 17, disengaging DIN rail 20. In addition, the spring wire 200 is deflected or bowed to have an arcuate shape, normally biasing the shuttle 18 toward the engage position to prevent inadvertent disengagement of the latching tangs 206 with the DIN rail 20. Other embodiments contemplate other type of biasing arrangements for shuttle 118, including coil springs, compression springs, tension springs, torsion springs, clock springs, and resilient hinges, for example.

Figure 18:
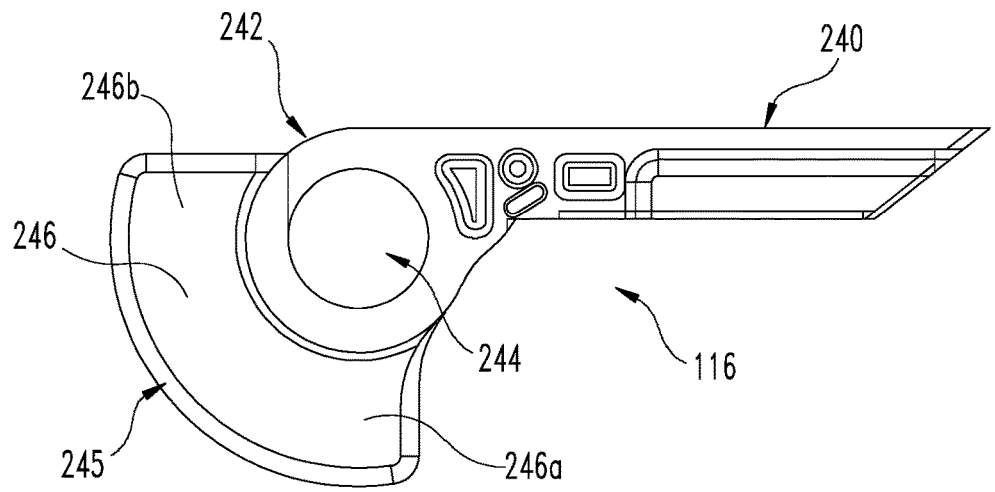
FIG. 18 shows a side view of a lever of the latching assembly.
Figure 19:
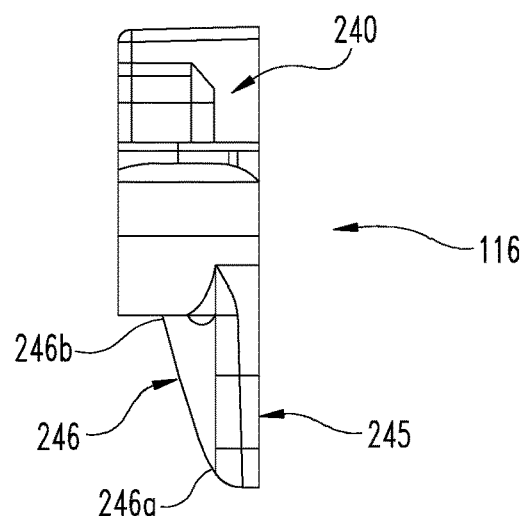
FIG. 19 shows a right end view of the lever of FIG. 18.

Referring now to FIGS. 18 and 19, one embodiment of the lever 116 includes a handle 240 extending from a mount 242 with a bore 244 extending through mount 242. An arcuate cam 245 extends radially outwardly from and partially around the mount 242. The cam 245 has a laterally-outwardly directed cam surface 246 that extends arcuately from a first end 246a to a second end 246b of cam surface 246. The cam surface 246 is tapered such that the cam surface 246 extends outwardly more at the second end 246b than at the first end 246a so that cam 245 is thicker at second end 246b than first end 246a, as is shown in FIG. 19.

The lever 116 is rotatably mounted to an interior post 250 of the mounting structure 162. The post 250 projects laterally outward from an interior wall 252 and extends through the bore 244 of the lever 116. Lateral channel 220 extends through the interior wall 252. Interior wall 252 is adjacent to but spaced inwardly from the adjacent outer side wall of mounting structure 162. As noted above with respect to mounting structure 130, the interior wall may also be spaced substantially inwardly from the outer side wall.

The cam 245 is disposed between the interior wall 252 and the cam follower 210 of shuttle 118, with the dome 212 of the cam follower 210 contacting the cam surface 246. When the lever 116 is in the latched position, as shown in FIG. 20, the dome 212 of cam follower 210 is in contact with the first end 246a of the cam surface 246. In this position, the cam 245 does not exert a lateral force on the cam follower 210 and, thus, does not exert a lateral force on the shuttle 118.

When the lever 116 is rotated counterclockwise from its latched position (where lever handle 240 is flush with the respective adjacent cover) and toward the unlatched position, as viewed from FIGS. 20 and 21, the cam surface 246 moves under the dome 212. Since the cam surface 246 moving under the dome 212 increasingly extends laterally outwardly, the cam surface 246 applies an outwardly laterally directed force on the cam follower 210 to force it way from interior wall 252 and, thus, the displace the shuttle 118. As a result, the shuttle 118 moves laterally outwardly, against the bias of the spring wire 200. When the lever 116 reaches the unlatched position (shown in FIG. 21), the dome 212 is in contact with the second end 246b of the cam surface 246, displacing the latching tangs 206 from being engaged to the DIN rail 20.

The I/O bases 32 and the controller base 52 are mounted to the DIN rail 20 without the I/O modules 30 and at least the leftmost one of the controller modules 50 being mounted thereto, respectively. This is required in order to permit the levers 116 of the latching assemblies 114 to be manually manipulated. The I/O bases 32, the controller base 52 and the top and bottom end modules 16, 18 are mounted to the DIN rail 20 by substantially the same mechanism and substantially in the same manner. Each of these devices is mounted to the DIN rail 20 by first moving the lever 116 of each latching assembly 114 of the device to the unlatched position, thereby moving the shuttle(s) 118 to the disengaged position, wherein the latching tangs 206 are not disposed in the rail channel (88, 134, 166 or 186). The side of each device is then laterally tilted and the mounting tabs 199 are inserted behind a side flange of the DIN rail 20. The device is pivoted inward to move the rail channel (88, 134, 166 or 186) over the DIN rail 20. With the DIN rail 20 disposed in the rail channel (88, 134, 166 or 186), each lever 116 of the device is moved to the latched position, thereby moving the latching tangs 206 into the rail channel (88, 134, 166 or 186), under an opposing side flange of the DIN rail 20. At this point, the side flanges of the DIN rail 20 are trapped inside the rail channel (88, 134, 166 or 186) by the tabs 199 and the latching tangs 206, thereby securing the device to the DIN rail 20. As described above the controller base 52 and each of the I/O bases 32 has two latching assemblies 114 and, thus, two levers 116. Thus, for the controller base 52 and each of the I/O bases 32, two levers 116 are manipulated to mount the device to the DIN rail 20.

Once the controller base 52 and the I/O bases 32 are mounted to the DIN rail 20 as described above, at least the leftmost one of the controller modules 50 and the I/O modules 30 are mounted to the controller base 52 and the I/O bases 32, respectively, by inserting the plugs 42 of the leftmost controller module 50 and the I/O modules 30 into the sockets 104, 144 of the controller base 52 and the I/O bases 32, respectively.

Various aspects of the present disclosure are contemplated. According to one aspect, a module assembly for a control system is disclosed that includes a base configured for removably mounting to an elongated rail. The base includes a mounting structure including a body with a first side and a second side. The first side defines a rail channel for receiving the elongated rail. The body and the rail channel further extend between opposite ends of the mounting structure. The mounting structure further includes opposite first and second side walls extending between the opposite ends thereof. The mounting structure further includes an interior wall and a lateral channel in communication with and extending transversely to the rail channel. The lateral channel opens through the interior wall. The base also includes a cover mounted to the second side of the mounting structure and a circuit board between the mounting structure and the cover. At least one latching assembly includes a shuttle movably received in the lateral channel and through the lateral channel opening in the interior wall. The latching assembly includes a lever rotatably mounted to the interior wall in operable engagement with the shuttle so that rotation of the lever moves the shuttle from a first position where the shuttle is engageable to the elongated rail in the rail channel and a second position where the shuttle is disengageable from the elongated rail in the rail channel.

In one embodiment, the module assembly includes at least one control module. The cover includes a slot and the lever is received in the slot. The circuit board includes a socket extending through an opening of the cover for electrically engaging the at least one control module to the circuit board. The socket is arranged so that the at least one control module is positioned on the lever when the control module is engaged to the socket.

In a refinement of this embodiment, the circuit board includes a second socket extending through a second opening of the cover for electrically engaging a second control module to the circuit board. In another refinement of this embodiment, the at least one control module includes circuitry for processing control signals and a housing enclosing the circuitry. In yet a further refinement of this embodiment, the at least one control module is an I/O module that processes and conditions field inputs received from field devices or control outputs received from a controller module. In still another refinement of this embodiment, the at least one control module is a controller module and the circuit board includes a connector extending through the cover that is an Ethernet jack for receiving a plug of an Ethernet cable having another plug connected to another controller module or to an operator workstation.

In another embodiment, the cover includes a slot and the lever is positioned in the slot. The circuit board includes a communication connector extending through an opening of the cover for establishing communication with one or more external devices. In a refinement of this embodiment, the cover includes a second opening and the circuit board includes a power connector extending through the second opening for connection to a module power supply.

In another embodiment, a spring wire is engaged to the mounting structure in an arcuate depression in an inner surface of the mounting structure along the rail channel. The shuttle includes a hook engaged to the spring wire, and the spring wire normally biases the shuttle toward the first position.

In a refinement of this embodiment, the mounting structure includes tabs extending into the rail channel for engaging a first side of the rail and the shuttle includes mounting appendages with tangs formed by an undercut in each of the mounting appendages. The tangs removably engage a side of the rail opposite the tabs when the shuttle is in the first position. In a further refinement, the lateral channel forms a recess in the inner surface of the mounting body and extends across the rail channel. The shuttle includes an elongated body in the lateral channel. The elongated body extends from the hook at a first end of the elongated body to a cam follower at an opposite second end of the elongated body.

In yet a further refinement, the lever includes a handle and a cam. The cam defines a cam surface that engages the cam follower. The cam surface extends from a first end to a second end and transitions from a first thickness at the first end to a second thickness at the second end of the cam surface. The first end of the cam surface is engaged to the cam follower when the shuttle is in the first position, and rotation of the lever moves the cam surface along the cam follower to the second end of the cam surface to translate the shuttle against the biasing of the spring wire from the first position to the second position.

In another refinement, the lever includes a mount that is rotatably mounted to the interior wall. The cam surface extends around a first side of the mount, and the lever includes a handle extending from a second side of the mount opposite the first side. In a further refinement, the interior wall includes a post that is received in a bore of the mount to rotatably mount the lever to the interior wall. In still a further refinement, the mounting structure includes a pair of rails in the opening and the pair of mounting appendages extend from the elongated body of the shuttle on opposite sides of the pair of rails.

In another embodiment, the mounting structure includes an inner surface extending along the rail channel between the opposite ends of the mounting structure. The lateral channel forms a recess in the inner surface that extends across the rail channel. The shuttle includes an elongated body in the lateral channel. The elongated body extends from a hook at a first end of the elongated body to a cam follower at an opposite second end of the elongated body. In a refinement of this embodiment, the lever includes a handle and a cam. The cam defines a cam surface that engages the cam follower. The cam surface extends from a first end to a second end, and the cam surface transitions from a first thickness at the first end to a second thickness at the second end. The first end of the cam surface is engaged to the cam follower when the shuttle is in the first position, and rotation of the lever moves the cam surface along the cam follower to the second end of the cam surface to translate the shuttle from the first position to the second position.

In another embodiment, the shuttle includes mounting appendages on opposite sides of the shuttle adjacent a first end of the shuttle. The mounting appendages project from an elongated body of the shuttle and each mounting appendage includes a tang formed by an undercut in the mounting appendage. The tangs removably engage the rail when the shuttle is in the first position. In another embodiment, the cover includes a slot and the lever resides in the slot, and in the first position the lever is flush with an outer surface of the cover.

In yet another embodiment, the at least one latching assembly includes a first latching assembly and a second latching assembly, and the mounting structure includes a second lateral channel in communication with the rail channel and a second interior wall through which the second lateral channel opens. The second latching assembly includes a second shuttle movably received in the second lateral channel and through the corresponding opening in the second interior wall and a second lever rotatably mounted to the second interior wall in operable engagement with the second shuttle so that rotation of the second lever moves the second shuttle between the first and second positions.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope.

What is claimed is:

1. A module assembly for a control system, the module assembly comprising:
    a base configured for removably mounting to an elongated rail, the base comprising:
        a mounting structure including a body with a first side and a second side, the first side defining a rail channel for receiving the elongated rail, the body and the rail channel further extending between opposite ends of the mounting structure, the mounting structure further including opposite first and second outer side walls extending between the opposite ends thereof, the mounting structure further including an interior wall spaced inwardly from and facing one of said first and second outer side walls and a lateral channel in communication with and extending transversely to the rail channel, the lateral channel opening through the interior wall;
        a cover mounted to the second side of the mounting structure;
        a circuit board between the mounting structure and the cover; and
        at least one latching assembly including a shuttle movably received in the lateral channel and through the lateral channel opening in the interior wall, the latching assembly including a lever rotatably mounted to the interior wall in operable engagement with the shuttle so that rotation of the lever moves the shuttle from a first position wherein the shuttle is engageable to the elongated rail in the rail channel and a second position wherein the shuttle is disengageable from the elongated rail in the rail channel.

2. The module assembly of claim 1, further comprising at least one control module, wherein:
    the cover includes a slot and the lever is received in the slot; and
    the circuit board includes a socket extending through an opening of the cover for electrically engaging the at least one control module to the circuit board, the socket being arranged so that the at least one control module is positioned on the lever when the control module is engaged to the socket.

3. The module assembly of claim 2, wherein the circuit board includes a second socket extending through a second opening of the cover for electrically engaging a second control module to the circuit board.

4. The module assembly of claim 2, wherein the at least one control module comprises circuitry for processing control signals and a housing enclosing the circuitry.

5. The module assembly of claim 2, wherein the at least one control module is an input/output (I/O) module that processes and conditions field inputs received from field devices or control outputs received from a controller module.

6. The module assembly of claim 2, wherein the at least one control module is a controller module and the circuit board includes a connector extending through the cover that is an Ethernet jack for receiving a plug of an Ethernet cable having another plug connected to another controller module or to an operator workstation.

7. The module assembly of claim 1, wherein:
the cover includes a slot and the lever is positioned in the slot; and
the circuit board includes a communication connector extending through an opening of the cover for establishing communication with one or more external devices.

8. The module assembly of claim 7, wherein the cover includes a second opening and the circuit board includes a power connector extending through the second opening for connection to a module power supply.

9. The module assembly of claim 1, further comprising a spring wire engaged to the mounting structure in an arcuate depression in an inner surface of the mounting structure along the rail channel, wherein the shuttle includes a hook engaged to the spring wire, the spring wire normally biasing the shuttle toward the first position.

10. The module assembly of claim 9, wherein the mounting structure includes tabs extending into the rail channel for engaging a first side of the rail and the shuttle includes mounting appendages with tangs formed by an undercut in each of the mounting appendages, the tangs removably engaging a side of the rail opposite the tabs when the shuttle is in the first position.

11. The module assembly of claim 10, wherein:
the lateral channel forms a recess in the inner surface of the mounting structure, the lateral channel extending across the rail channel; and
the shuttle includes an elongated body in the lateral channel, the elongated body extending from the hook at a first end of the elongated body to a cam follower at an opposite second end of the elongated body.

12. The module assembly of claim 11, wherein:
the lever includes a handle and a cam, the cam defining a cam surface that engages the cam follower, the cam surface extending from a first end to a second end, the cam surface transitioning from a first thickness at the first end to a second thickness at the second end; and
the first end of the cam surface is engaged to the cam follower when the shuttle is in the first position, and rotation of the lever moves the cam surface along the cam follower to the second end of the cam surface to translate the shuttle against the biasing of the spring wire from the first position to the second position.

13. The module assembly of claim 12, wherein:
the lever includes a mount that is rotatably mounted to the interior wall;
the cam surface extends around a first side of the mount; and
the lever includes a handle extending from a second side of the mount opposite the first side.

14. The module assembly of claim 13, wherein the interior wall includes a post that is received in a bore of the mount to rotatably mount the lever to the interior wall.

15. The module assembly of claim 14, wherein the mounting structure includes a pair of rails in an opening in a sidewall of the mounting structure and the pair of mounting appendages extend from the elongated body of the shuttle on opposite sides of the pair of rails.

16. The module assembly of claim 1, wherein the cover includes a slot and the lever resides in the slot, and in the first position the lever is flush with an outer surface of the cover and in the second position the lever projects outwardly from the outer surface of the cover.

17. The module assembly of claim 1, wherein the at least one latching assembly includes a first latching assembly and a second latching assembly, and the mounting structure includes a second lateral channel in communication with the rail channel and a second interior wall through which the second lateral channel opens, wherein the second latching assembly includes a second shuttle movably received in the second lateral channel and through the corresponding opening in the second interior wall and a second lever rotatably mounted to the second interior wall in operable engagement with the second shuttle so that rotation of the second lever moves the second shuttle between the first and second positions.

18. A module assembly for a control system, the module assembly comprising:
a base configured for removably mounting to an elongated rail, the base comprising:
a mounting structure including a body with a first side and a second side, the first side defining a rail channel for receiving the elongated rail, the body and the rail channel further extending between opposite ends of the mounting structure, the mounting structure further including opposite first and second side walls extending between the opposite ends thereof, the mounting structure further including an interior wall and a lateral channel in communication with and extending transversely to the rail channel, the lateral channel opening through the interior wall;
a cover mounted to the second side of the mounting structure;
a circuit board between the mounting structure and the cover; and
at least one latching assembly including a shuttle movably received in the lateral channel and through the lateral channel opening in the interior wall, the latching assembly including a lever rotatably mounted to the interior wall in operable engagement with the shuttle so that rotation of the lever moves the shuttle from a first position wherein the shuttle is engageable to the elongated rail in the rail channel and a second position wherein the shuttle is disengageable from the elongated rail in the rail channel, wherein:
the mounting structure includes an inner surface extending along the rail channel between the opposite ends of the mounting structure;
the lateral channel forms a recess in the inner surface that extends across the rail channel; and the shuttle includes an elongated body in the lateral channel, the elongated body extending from a hook at a first end of the elongated body to a cam follower at an opposite second end of the elongated body.

19. The module assembly of claim 18, wherein:
the lever includes a handle and a cam, the cam defining a cam surface that engages the cam follower, the cam surface extending from a first end to a second end, the cam surface transitioning from a first thickness at the first end to a second thickness at the second end; and
the first end of the cam surface is engaged to the cam follower when the shuttle is in the first position, and rotation of the lever moves the cam surface along the cam follower to the second end of the cam surface to translate the shuttle from the first position to the second position.

20. A module assembly for a control system, the module assembly comprising:
a base configured for removably mounting to an elongated rail, the base comprising:
a mounting structure including a body with a first side and a second side, the first side defining a rail channel for receiving the elongated rail, the body and the rail channel further extending between opposite ends of the mounting structure, the mounting structure further including opposite first and second side walls extending between the opposite ends thereof, the mounting structure further including an interior wall and a lateral channel in communication with and extending transversely to the rail channel, the lateral channel opening through the interior wall;
a cover mounted to the second side of the mounting structure;
a circuit board between the mounting structure and the cover; and
at least one latching assembly including a shuttle movably received in the lateral channel and through the lateral channel opening in the interior wall, the latching assembly including a lever rotatably mounted to the interior wall in operable engagement with the shuttle so that rotation of the lever moves the shuttle from a first position wherein the shuttle is engageable to the elongated rail in the rail channel and a second position wherein the shuttle is disengageable from the elongated rail in the rail channel, wherein the shuttle includes mounting appendages on opposite sides of the shuttle adjacent a first end of the shuttle, the mounting appendages projecting from an elongated body of the shuttle and each mounting appendage including a tang formed by an undercut in the mounting appendage, the tangs removably engaging the rail when the shuttle is in the first position.

* * * * *